United States Patent
Smith et al.

(10) Patent No.: US 7,635,919 B1
(45) Date of Patent: Dec. 22, 2009

(54) LOW MODULUS STRESS BUFFER COATING IN MICROELECTRONIC DEVICES

(75) Inventors: Guy N. Smith, Cedar Rapids, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 264 days.

(21) Appl. No.: 11/138,112

(22) Filed: May 26, 2005

(51) Int. Cl.
- H01L 23/52 (2006.01)
- H01L 23/48 (2006.01)
- H01L 29/40 (2006.01)

(52) U.S. Cl. .............................. 257/753; 257/E21.507; 257/700; 257/754; 257/756

(58) Field of Classification Search .......... 257/E21.502, 257/E21.507, E21.576, E23.167, 700, 792, 257/787, 790, 750, 753, 754, 756, 786
See application file for complete search history.

(56) References Cited

U.S. PATENT DOCUMENTS

| | | | | |
|---|---|---|---|---|
| 4,365,264 A | * | 12/1982 | Mukai et al. ................. | 257/759 |
| 4,723,197 A | * | 2/1988 | Takiar et al. ................. | 361/771 |
| 5,264,712 A | * | 11/1993 | Murata et al. ................. | 257/71 |
| 5,311,053 A | * | 5/1994 | Law et al. ..................... | 257/529 |
| 5,817,540 A | * | 10/1998 | Wark ........................... | 438/107 |
| 5,925,931 A | * | 7/1999 | Yamamoto ................... | 257/737 |
| 6,169,329 B1 | * | 1/2001 | Farnworth et al. ........... | 257/780 |
| 6,204,558 B1 | * | 3/2001 | Yanagida ..................... | 257/737 |
| 6,300,162 B1 | | 10/2001 | Shiel et al. ................... | 438/106 |
| 6,337,269 B1 | * | 1/2002 | Huang et al. ................. | 438/618 |
| 6,762,113 B2 | | 7/2004 | Jeans et al. ................... | 438/492 |

\* cited by examiner

Primary Examiner—Chris C Chu

(57) ABSTRACT

A method for protecting an electronic component including a semiconductor chip with a first elastic modulus includes steps as follows. At least one application of a first protective substance is applied on an outer surface of the semiconductor chip. The first protective substance has a second elastic modulus. A second substance is applied to an outer surface of the first protective substance. The second substance has a third elastic modulus. The second elastic modulus is substantially lower than the first elastic modulus and the third elastic modulus, and the first protective substance protects the semiconductor chip from damage during the application of the second substance and/or during the life of the semiconductor chip.

3 Claims, 3 Drawing Sheets

LOW MODULUS STRESS BUFFER COATING IN MICROELECTRONIC DEVICES

FIELD OF THE INVENTION

The present invention generally relates to microelectronic devices and particularly to protecting semiconductor components from various kinds of damage.

BACKGROUND OF THE INVENTION

The manufacture of microelectronics has become a major worldwide industry. A typical process in manufacturing a microelectronic component includes securing a semiconductor chip or die on a circuit board/interconnect substrate. Small wires, welded into place using an automated welding process known as wire bonding, connect the electronic circuitry on the chip to circuitry on the circuit board/interconnect substrate. Such a process permits complex circuits to be made in a more standard durable package.

One issue that is of particular concern to the microelectronics industry is reverse engineering. Using readily available equipment, it is possible to analyze in detail the layout of a chip's circuitry and then copy the design for use in a competing product. Because reverse engineering a chip is significantly less expensive and may require less technology than designing a competing chip from scratch, the incentive to reverse-engineer a semiconductor chip is very great.

Various methods of defeating reverse engineering have been proposed. One such method is to cover a chip with an impermeable coating, such as a thermal spray, and then cure the coating using a predetermined cure schedule. The coating prevents analysis of the circuitry on the chip and cannot be removed without completely destroying the circuitry. One challenge of using impermeable coatings is that the ideal materials for such a coating behave quite differently from the silicon-based chip. Of particular concern is the difference in the coefficient of thermal expansion coupled with the high elastic modulus of each of the many materials involved. If the difference between the materials' coefficients of thermal expansion is too great in relationship to the modulus of the materials, a stress state of the material system develops that may be higher than what the strength of the circuitry can handle, therefore the circuitry becomes damaged. A chip exposed to this stress state in the application stage, in the curing stage, or in the field life may be adversely affected with respect to performance and may encounter unacceptable failure rates of the microelectronic chip or module.

Another issue, unrelated to reverse-engineering concerns, is that the top layer of microelectronic circuit lines on the chip is not designed to be resistant to aggressive scratching, impact, or temperature change. Even incidental contact with the chip may cause a failure of part of the circuitry in the chip.

Thus, it is desirable to protect a semiconductor chip from damage and protect the integrity of a semiconductor chip or module while preventing the chip or module from being reverse-engineered.

SUMMARY OF THE INVENTION

In a first exemplary aspect of the present invention, a method for protecting an electronic component including a semiconductor chip with a first elastic modulus includes steps as follows. At least one application of a first protective substance is applied on an outer surface of the semiconductor chip. The first protective substance has a second elastic modulus. A second substance is applied to an outer surface of the first protective substance. The second substance has a third elastic modulus. The second elastic modulus is substantially lower than the first elastic modulus and the third elastic modulus, and the first protective substance protects the semiconductor chip from damage during the application of the second substance and/or during the life of the semiconductor chip.

In an additional exemplary aspect of the present invention, a method for protecting an electronic component including a semiconductor chip with a first elastic modulus includes steps as follows. A first protective substance is applied to an outer surface of the semiconductor chip. The first protective substance has a second elastic modulus. A second substance is applied to an outer surface of the first protective substance. The second substance has a third elastic modulus. The second elastic modulus is substantially lower than the first elastic modulus and the third elastic modulus. The first protective substance protects the semiconductor chip from damage during the application of the second substance. One of thickness and viscosity of the first protective substance is variably controlled by adding a diluting agent thereto or by heating the semiconductor chip or the first protective substance prior to applying the first protective substance to the semiconductor chip.

In another exemplary aspect of the present invention, a microelectronic device includes (1) a semiconductor chip having a first elastic modulus; (2) a first protective substance applied to an outer surface of the semiconductor chip, the first protective substance having a second elastic modulus; and (3) a second substance applied to an outer surface of the first protective substance, the second substance having a third elastic modulus. The second elastic modulus is substantially lower than the first elastic modulus and the third elastic modulus.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
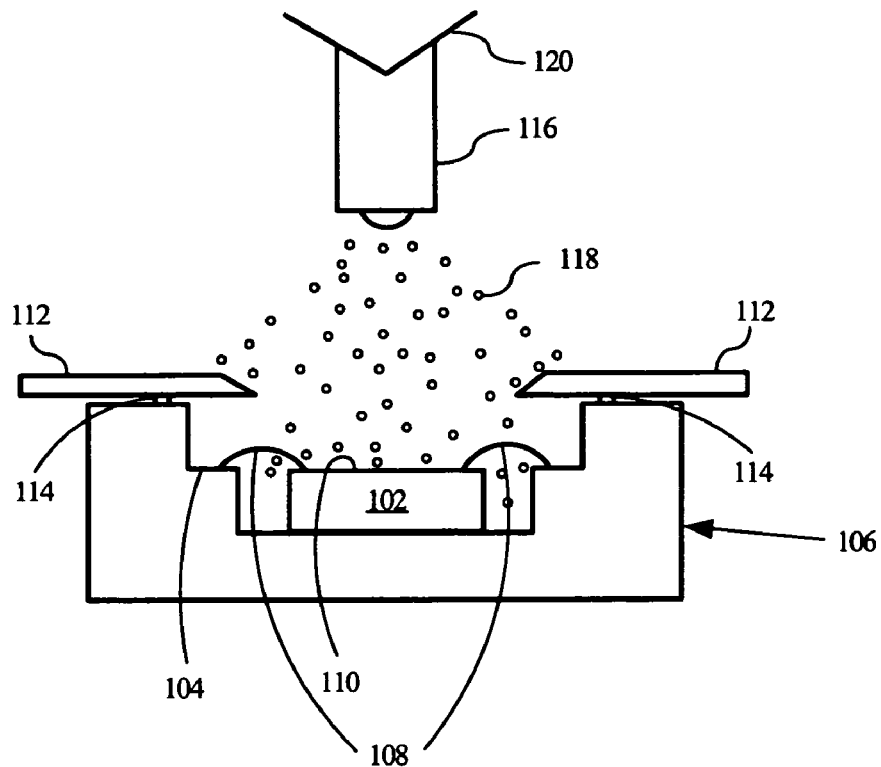
FIG. 1 is a schematic diagram illustrating a protective coating being applied to a semiconductor chip in accordance with an exemplary embodiment of the present invention.

Reference will now be made in detail to the presently preferred embodiments of the invention, examples of which are illustrated in the accompanying drawings.

The present invention may solve the problem of low component yield and reliability attributed to CTE (coefficient of thermal expansion) mismatch within high modulus, high strength materials. For example, the Thermal Spray coating used in the SAASM (Selective Availability Anti-Spoofing Module) MCM (Multi-Chip Module) may cause high stress states to semiconductors and induce damage because the Thermal Spray material is a high modulus material. Damage may occur during assembly, reliability testing, and the process of mounting the component onto the board. The present invention applies a low modulus material (e.g., polyimide, or the like) to the semiconductor surface to act as a stress buffer between the semiconductor and the next coating that is applied. An elastic modulus (also known as Young's modulus, or modulus) is a measure of the stiffness of a given material and is defined as the elastic relationship between stress and strain when a material is exposed to a mechanical load (Modulus=Stress/Strain). The present invention may be applied to SAASM or any other application that requires high reliability.

The present invention is based on the relationship of various material characteristics and their interactions with the semiconductor chip during assembly as well as their performance across various application environments. When two materials are bonded together, the interface between the two materials is subjected to what may become very high states of stress when exposed to applications temperature extremes. The stress is a function of the materials coefficient of thermal expansion, elastic modulus, and the deviation from reference temperature (temperature where there is zero stress). If two materials are bonded together which have different coefficient of thermal expansions as well as each having a relatively high modulus, the relative strain that is induced by the CTE mismatch may cause a state of stress that may potentially be higher than the fracture strength of the materials itself. In the case of a semiconductor, a high modulus coating on the circuitry may drive a stress state that is beyond what the circuitry can withstand, thereby causing damage to the circuitry. Another example of damage is de-lamination. The stress state that is induced may be higher than the adhesion of the two materials, thereby causing them to come apart. Because a fracture or de-lamination occurs when the stress state is too high, it is desirable to reduce the stress state. Since the stress state is induced by the relative strain associated with the CTE mismatch, it is desirable to either reduce the relative strain or modify the ratio between the stress and the strain. This may be achieved with modulus. If a thin low modulus material is placed between the two high modulus materials, the amount of stress that is induced by the relative strain may be much lower, therefore avoiding the damage. The low modulus material is described as a stress buffer. The stress buffer may be comprised of one or more layers or applications on an outer surface of a semiconductor chip. The stress buffer may be applied onto the outer surface of a semiconductor chip using a method such as spraying, dispensing, spinning, vapor deposition, or the like.

FIG. 1 shows a semiconductor die or chip 102 attached to bond pads 104 of an interconnect substrate 106. It is understood that even though the interconnect substrate 106 shown in FIG. 1 is not flat (in a cavity), the interconnect substrate 106 may alternatively be flat without departing from the scope and spirit of the present invention. Wire bonds 108 connect the circuitry of the chip 102 with the circuitry of the interconnect substrate 106. As is known in the art, multiple semiconductor chips may be attached to a single interconnect substrate to form a multi-chip module. As previously discussed, it may be desirable to apply a coating to an outer surface 110 of the chip 102 to ruggedize the chip 102 or make the chip 102 more tamper-resistant.

Since the chip 102 has a high elastic modulus, if the coating or its primer has a high elastic modulus, it is likely that damage may occur to the chip during the normal heat-intensive application and/or curing process. The present invention solves the foregoing-described problem by providing a method in which a stress buffer or protective substance P (e.g., polyimide or the like), whose elastic modulus is substantially lower than that of the semiconductor chip and that of the tamper-resistant coating, is applied to the outer surface 110 of the chip 102 prior to applying the tamper-resistant coating or its primer. For example, while the semiconductor chip may have an elastic modulus of ~100 GPa and the tamper-resistant coating may have an elastic modulus of ~50 GPa, the protective substance P may have an elastic modulus of <10 GPa.

Figure 2:
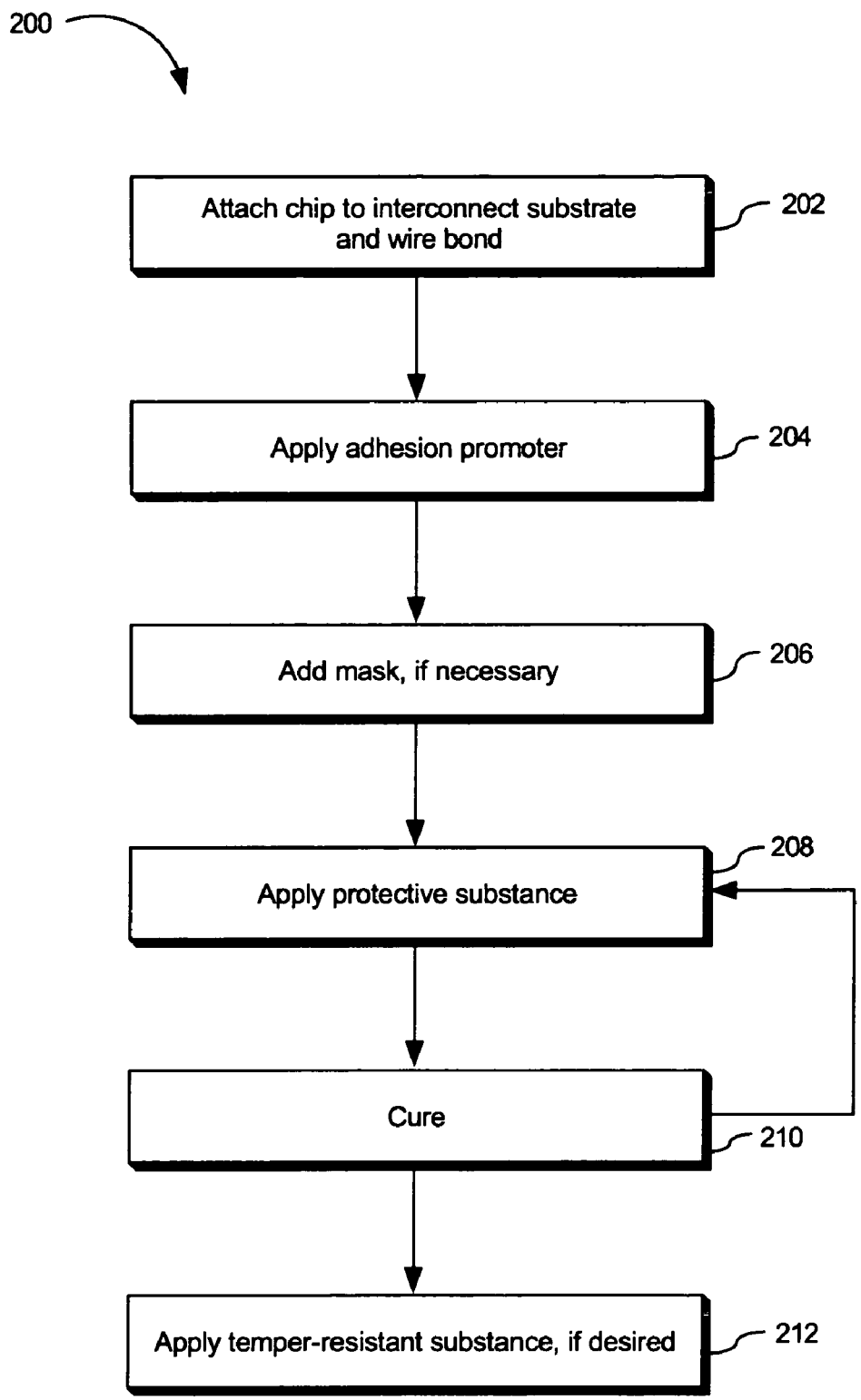
FIG. 2 is a flow diagram of a method for protecting an electronic component including a semiconductor chip in accordance with an exemplary embodiment of the present invention.

FIG. 2 is a flowchart describing an exemplary method 200 of the present invention. In step 202, a semiconductor die or chip is attached to an interconnect substrate and wire bond. For example, as shown in FIG. 1, the chip 102 is attached to the interconnect substrate 106 and wire bonded. In step 204, an adhesion promoter may be applied to an outer surface of the chip (e.g., the outer surface 110 as shown in FIG. 1) to aid in the adhesion of a protective substance P to the outer surface. The protective substance P (e.g., polyimide or the like) has an elastic modulus substantially lower than that of the semiconductor chip and that of the tamper-resistant coating. In step 206, a removable mask (e.g., a mask 112 as shown in FIG. 1) is placed around the chip to isolate the area where the protective substance P is to be applied. As shown in FIG. 1, the mask 112 may rest upon or otherwise protect a seal ring 114, which forms part of the interconnect substrate 106. In step 208, the protective substance P is applied to the outer surface of the chip using a method such as spraying, dispensing, spinning, vapor deposition, or the like. For example, this is accomplished in FIG. 1 by providing a spray nozzle 116 that dispenses the protective substance P in a fine, atomized spray 118 such that very small droplets of the protective substance P are deposited on the outer surface 110. The spray nozzle 116 may be part of a manually held airbrush 120, or may alternatively be part of an automated spray system. After the protective substance P is applied to the outer surface of the chip, in step 210 the chip is placed in an oven (not shown) to cure or partially cure the protective substance P. The temperature and duration of the curing process depends on the specific materials involved. After the layer of protective substance P has been at least partially cured on the outer surface of the chip, additional layers of the protective substance P may be placed thereon by repeating the applying and curing steps 208, 210 as outlined above. If multiple layers of protective substance are desired, the curing step 210 between each application may be shortened. In step 212, a tamper-resistant substance is applied, if desired, to the outer surface of the chip, which is now covered with a layer of protective substance P. This step may also include the application of a primer, if required. The layer of the protective substance P protects the chip from damage due to heat and mechanical impact during the application of the tamper-resistant substance and CTE mismatches between the chip and the tamper-resistant substance or its primer.

As shown in FIG. 1, the removable mask 112 may prevent contamination or damage to the seal ring 114 and interconnect substrate 106 during application of the protective substance P. Specifically, droplets of the protective substance P may bridge one or more of wire bonds 108, and the wire bonds 108 may be damaged or electrically shorted by the shrinkage of the protective substance P during the curing operation.

The thickness of the layers of the protective substance P may be controlled by varying the number of applications of the protective substance P or by diluting the protective substance P as desired. Diluting protective substance P may also modify its viscosity. This may aid in the transfer of the protective substance P from the spray nozzle 116 to the outer surface 110. The thickness and/or viscosity of the protective substance P may also be varied by heating the chip 102 and/or the protective substance P prior to application.

Figure 3:
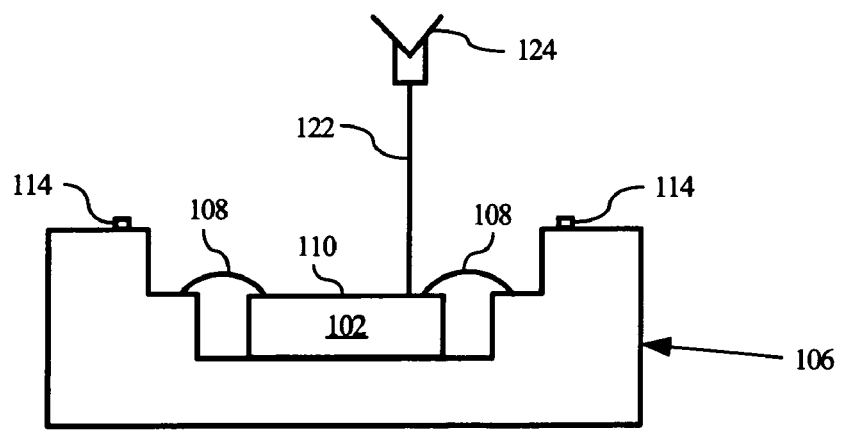
FIG. 3 is a schematic diagram illustrating a protective coating being applied to a semiconductor chip in accordance with another exemplary embodiment of the present invention.

FIG. 3 shows another embodiment of the present invention. Instead of spraying the protective substance P onto the outer surface 110, it is possible to accurately place small droplets of the protective substance P on predetermined portions of the outer surface 110 using a needle 122. The needle 122 may be part of a dispensing system 124, which may be a manually actuable syringe or an automated injection system. The needle 122 may be controlled to place predetermined quantities of the protective substance P in a specified pattern upon the outer surface 110. An advantage of such precision application is that the protective substance P is less likely to get on the wire bonds and seal ring, and consequently the need for a protective mask is greatly reduced.

In an alternative embodiment, the protective substance P may be applied to a semiconductor chip before the chip is attached to an interconnect substrate. For example, the protective substance P may be spun onto a silicon wafer containing the chip using known spinning techniques. The thickness of the layer of the protective substance P may be controlled by varying the wafer spin speed and spin duration, or by preheating or thinning the protective substance P as previously discussed. Those of ordinary skill in the art will understand that the protective substance P may be applied to a semiconductor chip using a method such as dispensing, vapor deposition, or the like without departing from the scope and spirit of the present invention.

Figure 4:
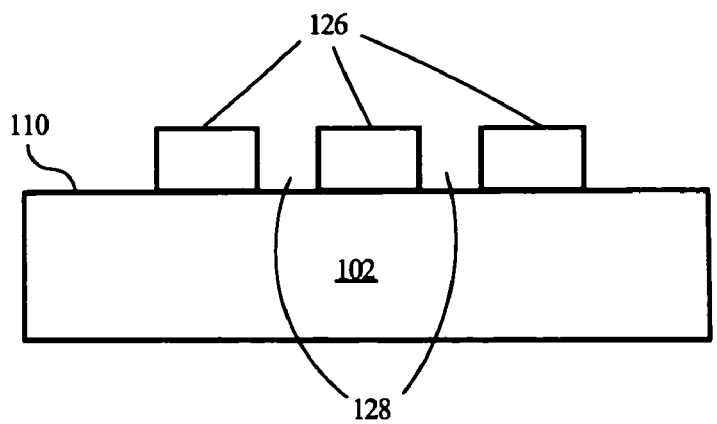
FIG. 4 shows a surface of a semiconductor chip.
Figure 5:
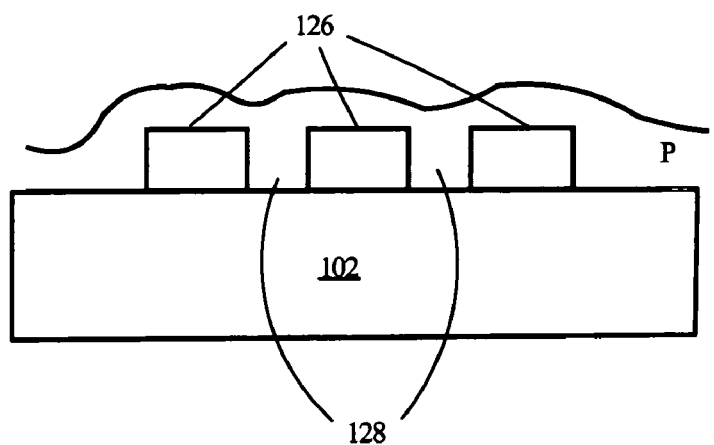
FIG. 5 shows a surface of the semiconductor chip of FIG. 4 after application of a protective coating in accordance with an exemplary embodiment of the present invention.

FIG. 4 shows a cross-section of the chip 102 prior to applying the protective substance P thereto. Traces or circuit lines 126 protrude from the outer surface 110. FIG. 5 shows a cross-section of the chip 102 after applying the protective substance P thereto. As shown, the spaces 128 between the traces or circuit lines 126 are substantially filled. Furthermore, the protective substance P creates a more planar outer surface than without the protective substance P. When the surface is "planarized," it is less likely to be damaged by physical contact such as scratching. This planarization is another aspect of the protection that the protective substance P affords to the chip.

It should be noted that the application of the protective substance P is in addition to the typical semiconductor passivation layer that may be applied to a chip.

Figure 6:
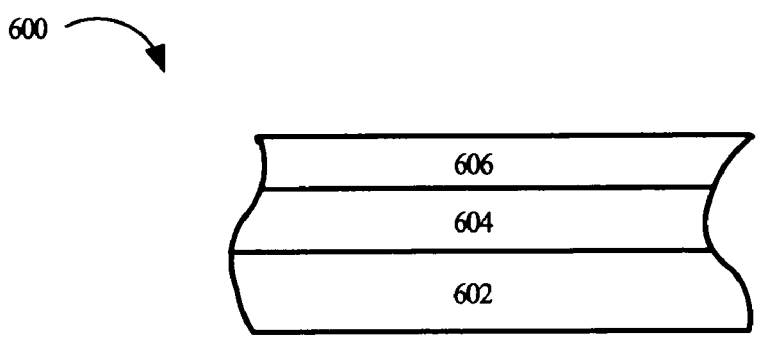
FIG. 6 is a partial cross-sectional view of a microelectronic device in accordance with an exemplary embodiment of the present invention.

FIG. 6 is a partial cross-sectional view of a microelectronic device 600 in accordance with an exemplary embodiment of the present invention. A semiconductor chip 602 has a first elastic modulus. A first protective substance 604 is applied to an outer surface of the semiconductor chip 602. The first protective substance has a second elastic modulus. A second substance 606 is applied to an outer surface of the first protective substance 604. The second substance 606 has a third elastic modulus. The second elastic modulus is substantially lower than the first elastic modulus and the third elastic modulus. For example, the first protective substance 604 may be a polyimide or a polyimide mixed with an adhesion promoter, and the second substance 606 may be a tamper-resistant coating.

Thus, the present invention provides a method of protecting a semiconductor chip from damage. The present invention may also be used with other types of circuitry where it is desired to protect or prevent access to the circuitry.

One advantage of the present invention is that the protective substance P forms a buffer that provides protection from surface abrasion, surface penetration, tensile stress, CTE mismatches and ultraviolet exposure. This type of protection is especially important during the application of a thermal spray. Consequently, tamper-resistant coatings such as thermal sprays may be applied to a chip or die without significant damage thereto. This may dramatically decrease the failure rate of electronic components. Another advantage is that applying the protective substance P to the chip makes the outer surface of the chip more planar. Moreover, the protective substance may be applied to a semiconductor die at the wafer level, in a single chip package, or to a multi-chip package or application. This provides maximum flexibility when integrating the method of the present invention into manufacturing processes.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A microelectronic device, comprising:
   a semiconductor chip having a first elastic modulus and a first coefficient of thermal expansion;
   a passivation layer, said passivation layer being applied to an outer surface of said semiconductor chip;
   an adhesion promoter layer, said adhesion promoter layer being applied to an outer surface of the passivation layer;
   a first protective substance, said first protective substance being applied to an outer surface of said adhesion promoter layer, said first protective substance having a second elastic modulus;
   a primer applied to an outer surface of said first protective substance; and
   a second substance applied to an outer surface of said primer, said second substance having a third elastic modulus and a second coefficient of thermal expansion, said second substance being a tamper-resistant coating,
   wherein said second elastic modulus is substantially lower than said first elastic modulus and said third elastic modulus and said first coefficient of thermal expansion and said second coefficient of thermal expansion are not substantially similar.

2. The microelectronic device of claim 1, wherein said first protective substance is sprayed on said outer surface of said semiconductor chip using at least one of an airbrush or an automated spray system.

3. The microelectronic device of claim 1, wherein said first protective substance is applied onto said outer surface of said semiconductor chip by at least one of spinning, dispensing, or vapor deposition.

* * * * *